(12) United States Patent
Hong

(10) Patent No.: US 10,564,896 B2
(45) Date of Patent: Feb. 18, 2020

(54) DATA STORAGE DEVICE AND OPERATING METHOD THEREOF

(71) Applicant: SK hynix Inc., Gyeonggi-do (KR)

(72) Inventor: Ji Man Hong, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 15/997,057

(22) Filed: Jun. 4, 2018

(65) Prior Publication Data

US 2019/0121580 A1    Apr. 25, 2019

(30) Foreign Application Priority Data

Oct. 20, 2017    (KR) .......................... 10-2017-0136234

(51) Int. Cl.
*G06F 3/06* (2006.01)
*G11C 11/56* (2006.01)

(52) U.S. Cl.
CPC .......... *G06F 3/0659* (2013.01); *G06F 3/0604* (2013.01); *G06F 3/0679* (2013.01); *G11C 11/5628* (2013.01)

(58) Field of Classification Search
CPC .... G06F 3/0679; G06F 3/0659; G06F 3/0604; G11C 11/5628
USPC ........................................................ 711/103
See application file for complete search history.

(56) References Cited

U.S. PATENT DOCUMENTS

2014/0223084 A1*    8/2014    Lee .................... G06F 12/0246
711/103

FOREIGN PATENT DOCUMENTS

KR    101541736    8/2015

* cited by examiner

*Primary Examiner* — Hua J Song
(74) *Attorney, Agent, or Firm* — IP & T Group LLP

(57) ABSTRACT

A data storage device includes a nonvolatile memory device configured to include a plurality of pages; and a controller configured to control an operation of the nonvolatile memory device, wherein the controller stores first data in a first least significant bit (LSB) page, stores the first data in a first most significant bit (MSB) page which is coupled to the same first word line as the first LSB page, when a first condition is satisfied, and stores second data in the first MSB page after the first data is stored in the first MSB page.

20 Claims, 12 Drawing Sheets

DATA STORAGE DEVICE AND OPERATING METHOD THEREOF

CROSS-REFERENCES TO RELATED APPLICATION

The present application claims priority under 35 U.S.C. § 119(a) to Korean application number 10-2017-0136234, filed on Oct. 20, 2017, in the Korean Intellectual Property Office, which is incorporated herein by reference in its entirety.

BACKGROUND

1. Technical Field

Various embodiments generally relate to a data storage device. Particularly, the embodiments relate to a data storage device including a nonvolatile memory device.

2. Related Art

A data storage device may be configured to store the data provided from an external device, in response to a write request from the external device. Also, the data storage device may be configured to provide stored data to the external device, in response to a read request from the external device. The external device may be an electronic device capable of processing data such as a computer, a digital camera, or a mobile phone. The data storage device may be built in the external device, or may be manufactured in a detachable form and coupled to the external device.

A data storage device using a memory device has advantages of stability and durability because there is no mechanical driving part, and information access speed is high and power consumption is low. Data storage devices having such advantages include a universal serial bus (USB) memory device, memory cards having various interfaces, a universal flash storage (UFS) device, and a solid state drive (SSD).

SUMMARY

Various embodiments are directed to a multilevel cell (MLC) data storage device capable of preventing data from being lost under an unexpected situation such as a sudden power-off (SPO).

In an embodiment, a data storage device may include: a nonvolatile memory device configured to include a plurality of pages; and a controller configured to control an operation of the nonvolatile memory device, wherein the controller stores first data in a first least significant bit (LSB) page, stores the first data in a first most significant bit (MSB) page which is coupled to the same first word line as the first LSB page, when a first condition is satisfied, and stores second data in the first MSB page after the first data is stored in the first MSB page.

In an embodiment, a method for operating a data storage device may include: storing first data in a first least significant bit (LSB) page; and storing the first data in a first most significant bit (MSB) page which is coupled to the same first word line as the first LSB page, when second data does not exist at the first data is stored in the first LSB page.

In an embodiment, a method for operating a data storage device may include: transmitting a first storage command for first data to a first least significant bit (LSB) page, to a nonvolatile memory device by a controller; storing the first data in the first LSB page based on the first storage command by the nonvolatile memory device; transmitting a second storage command for the first data to a first most significant bit (MSB) page which is coupled to the same first word line as the first LSB page, to the nonvolatile memory device by the controller when a first condition is satisfied; storing the first data in the first MSB page based on the second storage command by the nonvolatile memory device; transmitting a third storage command for second data to the first MSB page, to the nonvolatile memory device by the controller; and storing the second data in the first MSB page based on the third storage command by the nonvolatile memory device.

In an embodiment, a memory system may include: a memory device including multi-level cell pages; and a controller configured to control the memory device to: program a first data into a LSB page of a selected word line; program the first data into a MSB page of the selected word line when the MSB page is empty; and program a second data into the MSB page In the data storage device and the method for operating the same according to the embodiments, by storing data stored in an LSB page, in an MSB page, the threshold voltage distribution of cells may be moved and thus it is possible to prevent data from being lost.

DETAILED DESCRIPTION

Figure 1:
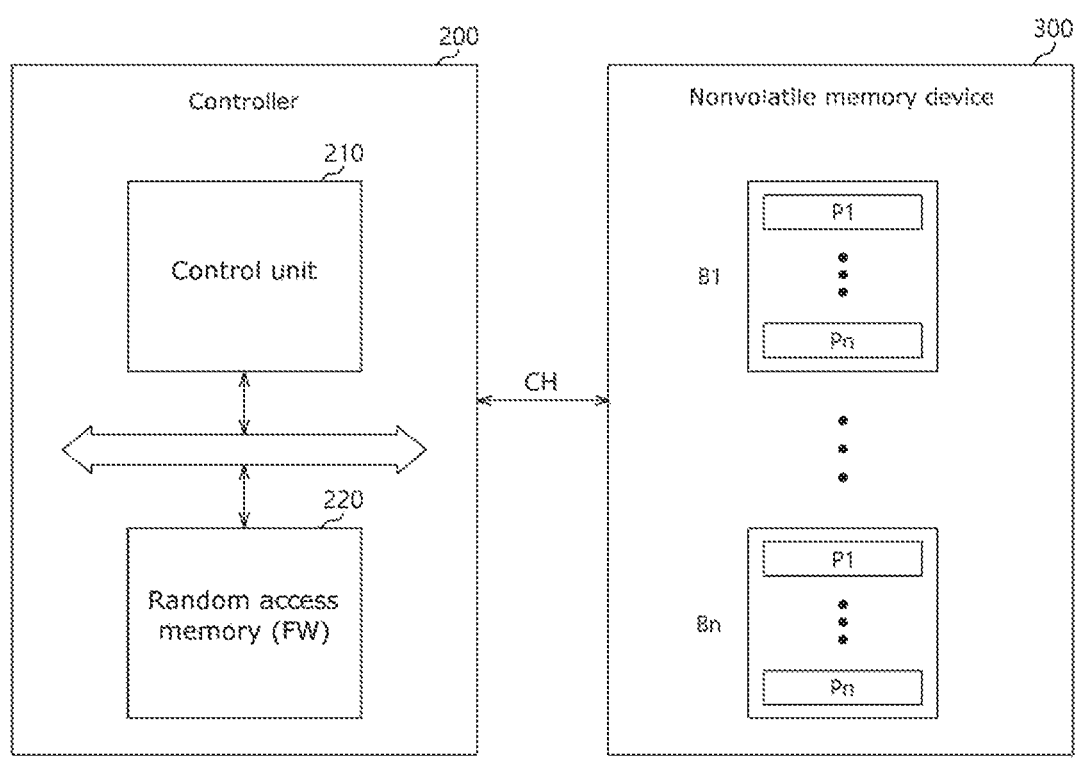
FIG. 1 is a block diagram schematically illustrating an example of a data storage device in accordance with an embodiment of the present disclosure.

In the present invention, advantages, features and methods for achieving them will become more apparent after a reading of the following exemplary embodiments taken in conjunction with the drawings. The present invention may, however, be embodied in different forms and should not be construed as being limited to the embodiments set forth herein. Rather, these embodiments are provided to describe the present invention in detail to the extent that a person skilled in the art to which the invention pertains can easily enforce the technical concept of the present invention.

It is to be understood herein that embodiments of the present invention are not limited to the particular embodiments shown in the drawings and that the drawings are not necessarily to scale and in some instances proportions may have been exaggerated in order to more clearly depict certain features of the invention. While particular terminology is used herein, it is to be appreciated that the terminology used herein is for the purpose of describing particular embodiments only and is not intended to limit the scope of the present invention.

As used herein, the term "and/or" includes any and all combinations of one or more of the associated listed items. It will be understood that when an element is referred to as being "on," "connected to" or "coupled to" another element, it may be directly on, connected or coupled to the other element or intervening elements may be present. As used herein, a singular form is intended to include plural forms as well, unless the context clearly indicates otherwise. It will be further understood that the terms "includes" and/or "including," when used in this specification, specify the presence of at least one stated feature, step, operation, and/or element, but do not preclude the presence or addition of one or more other features, steps, operations, and/or elements thereof.

Hereinafter, a data storage device and an operating method thereof will be described below with reference to the accompanying drawings through various examples of embodiments.

FIG. 1 is a block diagram schematically illustrating an example of a data storage device 100 in accordance with an embodiment of the present disclosure.

The data storage device 100 may store data to be accessed by a host device (not shown) such as a mobile phone, an MP3 player, a laptop computer, a desktop computer, a game player, a TV, an in-vehicle infotainment system, and so forth. The data storage device 100 may be referred to as a memory system.

The data storage device 100 may be manufactured as any one of various kinds of storage devices according to a host interface meaning a transmission protocol with respect to the host device. For example, the data storage device 100 may be configured as any one of various kinds of storage devices such as a solid state drive (SSD), a multimedia card in the form of an MMC, an eMMC, an RS-MMC and a micro-MMC, a secure digital card in the form of an SD, a mini-SD and a micro-SD, a universal serial bus (USB) storage device, a universal flash storage (UFS) device, a Personal Computer Memory Card International Association (PCMCIA) card type storage device, a peripheral component interconnection (PCI) card type storage device, a PCI express (PCI-E) card type storage device, a compact flash (CF) card, a smart media card, a memory stick, and so forth.

The data storage device 100 may be manufactured as any one among various kinds of package types. For example, the data storage device 100 may be manufactured as any one of various kinds of package types such as a package-on-package (POP), a system-in-package (SIP), a system-on-chip (SOC), a multi-chip package (MCP), a chip-on-board (COB), a wafer-level fabricated package (WFP) and a wafer-level stack package (WSP).

Referring to FIG. 1, the data storage device 100 may include a controller 200. The controller 200 may include a control unit 210 and a random access memory 220.

The control unit 210 may be configured by a micro control unit (MCU) or a central processing unit (CPU). The control unit 210 may process a request transmitted from the host device. In order to process the request, the control unit 210 may drive an instruction or algorithm of a code type, that is, a firmware FW, loaded in the random access memory 220, and may control internal function blocks and a nonvolatile memory device 300.

The random access memory 220 may be configured by a random access memory such as a dynamic random access memory (DRAM) or a static random access memory (SRAM). The random access memory 220 may store the firmware FW which is to be driven by the control unit 210. Also, the random access memory 220 may store data necessary for driving the firmware FW, for example, metadata. That is, the random access memory 220 may operate as the working memory of the control unit 210.

The data storage device 100 in accordance with the embodiment may also include the nonvolatile memory device 300 which is configured to include a plurality of pages P1 to Pn. The controller 200 may be configured to control the operation of the nonvolatile memory device 300.

Figure 2:
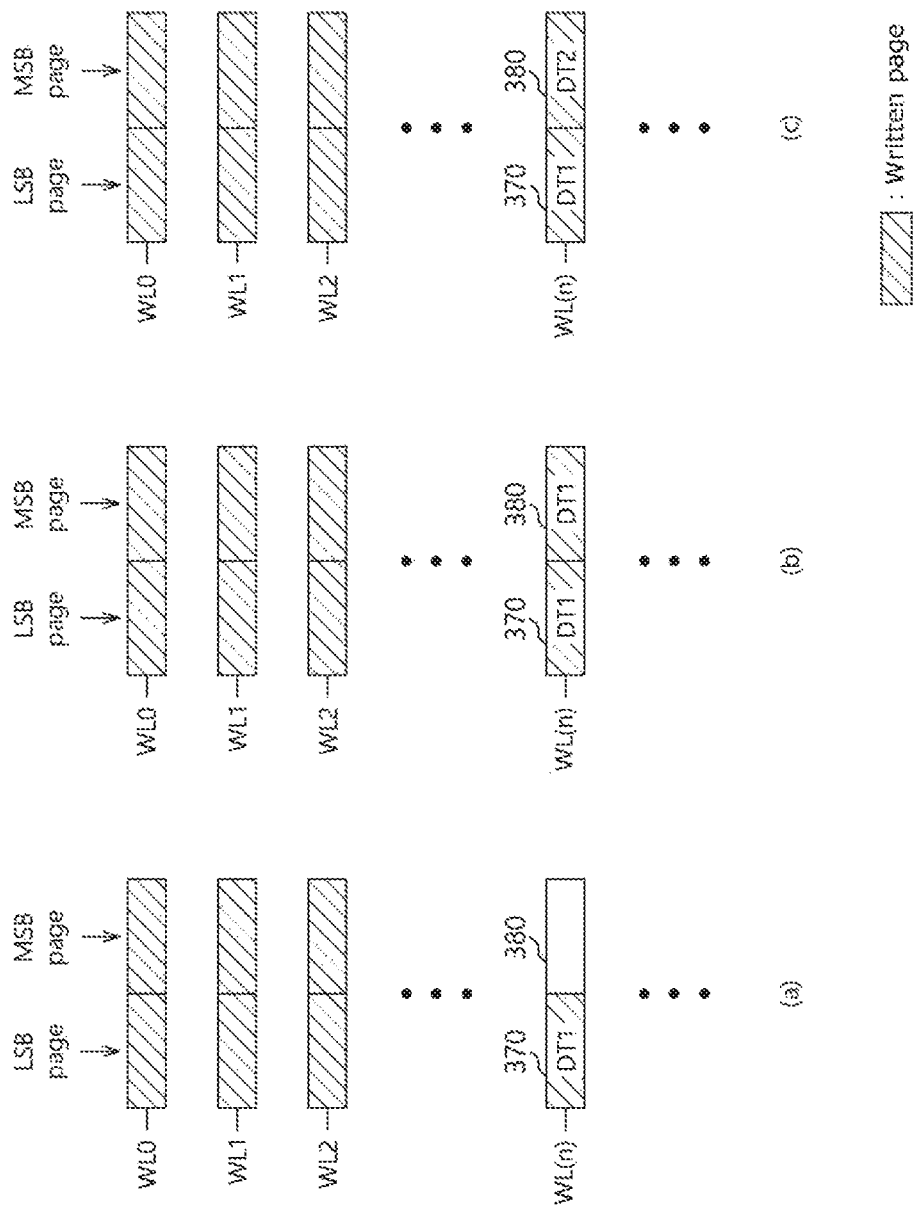
FIGS. 2 and 3 are diagrams explaining the data storage device in which data are stored in LSB and MSB pages in accordance with an embodiment of the present disclosure.
Figure 3:
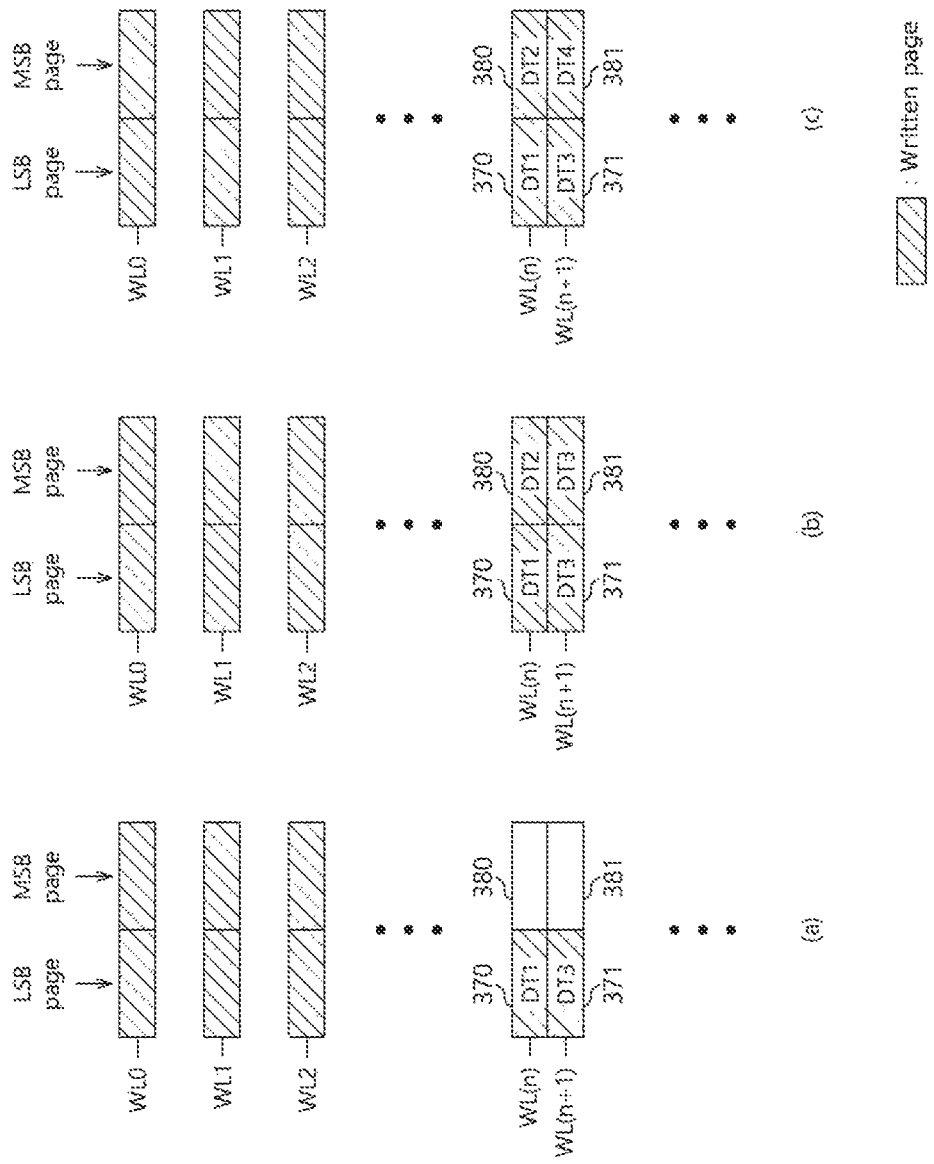

FIGS. 2 and 3 are diagrams explaining the data storage device in which data are stored in least significant bit (LSB) and most significant bit (MSB) pages according to the embodiment of the present disclosure.

Referring to FIG. 2, the controller 100 in accordance with the embodiment may store first data DT1 in a first LSB page 370, and when a first condition is satisfied, the first data DT1 may be stored in a first MSB page 380, which is coupled to the same first word line as the first LSB page 370. The controller 100 may store second data DT2 in the first MSB page 380 after the first data DT1 is stored in the first MSB page 380.

In detail, the first data DT1 may be stored in the first LSB page 370 that is coupled to an n-th word line WL(n), and the first data DT1 and the second data DT2 may be stored in the first MSB page 380 that is coupled to the same n-th word line WL(n) as the first LSB page 370. Specifically, the first data DT1 may be stored in the first LSB page 370 (as illustrated in (a) of FIG. 2), and the first data DT1 may be stored in the first MSB page 380 when the first condition is satisfied (as illustrated in (b) of FIG. 2). Thereafter, the second data DT2 may be stored in the first MSB page 380 based on a write command for the second data DT2 (as illustrated in (c) of FIG. 2).

The first condition may be a condition in which the second data DT2 does not exist in the random access memory 220 which is temporarily storing the second data DT2 to be stored in first MSB page 380 when the first data DT1 is stored in the first LSB page 370. Also, the first condition may be a condition in which the second data DT2 does not exist in the random access memory 220 until a reference time passes after the first data DT1 is stored in the first LSB page 370. However, it is to be noted that the embodiment is not limited thereto and the first condition may be set or changed at any point of time.

Although it is illustrated as an example that data are written in the LSB pages and MSB pages coupled to a zeroth word line WL0 to an (n−1)-th word line WL(n−1), it is to be noted that a page may exist in which no data is written in.

Referring to FIG. 3, in the data storage device in accordance with the embodiment, first data DT1 may be stored in a first LSB page 370 which is coupled to an n-th word line WL(n), third data DT3 may be stored in a second LSB page 371 which is coupled to an (n+1)-th word line WL(n+1), and the third data DT3 and fourth data DT4 may be stored in a second MSB page 381 which is coupled to the same (n+1)-th word line WL(n+1) as the second LSB page 371.

Specifically, the third data DT3 may be stored in the second LSB page 371 (as illustrated in (a) of FIG. 3), and the third data DT3 may be stored in the second MSB page 381 when a second condition is satisfied (as illustrated in (b) of FIG. 3). Thereafter, the fourth data DT4 may be stored in the second MSB page 381 based on a write command for the fourth data DT4 (as illustrated in (c) of FIG. 3).

While it is illustrated in (b) and (c) of FIG. 3 that second data DT2 is stored in a first MSB page 380, this is merely for illustrative purposes only. That is, when the third data DT3 or the fourth data DT4 is stored in the second MSB page 381, the first MSB page 380 may be in a state in which data is not stored therein.

The second condition may be a condition in which the fourth data DT4 does not exist in the random access memory 220 which is temporarily storing the fourth data DT4 to be stored in the second MSB page 381 when the third data DT3 is stored in the second LSB page 371. Also, the second condition may be a condition in which the fourth data DT4 does not exist in the random access memory 220 until a reference time passes after the third data DT3 is stored in the second LSB page 371. However, it is to be noted that the embodiment is not limited thereto and the second condition may be set or changed at any point of time.

Although it is illustrated as an example that data are written in the LSB pages and MSB pages coupled to a zeroth word line WL0 to an (n−1)-th word line WL(n−1), it is to be noted that a page may exist in which no data is written in. Further, although it is illustrated in (a) of FIG. 3 that data is not written in the first MSB page 380, this is merely for Illustrative purposes only, and (a) to (c) of FIG. 3 may be applied in the same manner even in a state in which the first data DT1 or the second data DT2 is stored in the first MSB page 380.

In the data storage device in accordance with the embodiment, the (n+1)-th word line WL(n+1) may be a word line which Is adjacent to the n-th word line WL(n). That is, after data is stored in the first LSB page 370, an LSB page in which data is to be stored immediately next may be the second LSB page 371. Similarly, after data is stored in the first MSB page 380, an MSB page in which data Is to be stored immediately next may be the second MSB page 381.

Also, the controller 100 in accordance with the embodiment may store the third data DT3 in the second LSB page 371 before storing the second data DT2 in the first MSB page 380.

Figure 4:
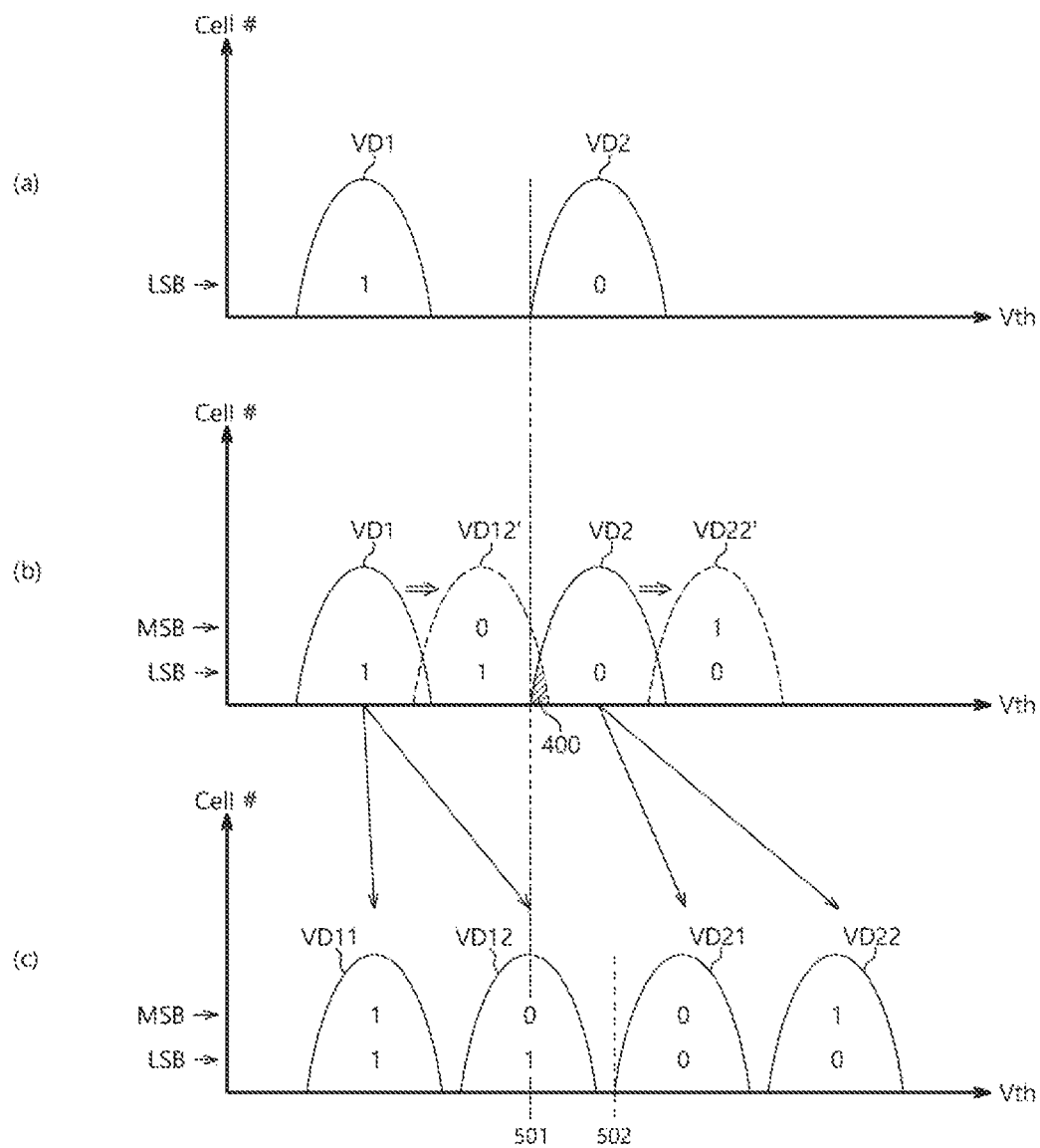
FIG. 4 is a diagram explaining a change in the threshold voltage distribution of cells when data is stored in an MSB page after data is stored in an LSB page.

FIG. 4 is a diagram explaining a change in the threshold voltage distribution of cells when data is stored in an MSB page after data is stored in an LSB page.

When a memory cell is stored with data, the memory cell may form a specific threshold voltage and may exert an interference effect on adjacent memory cells. The interfered memory cell may have a threshold voltage different from a threshold voltage which is originally formed when data is stored in the memory cell. That is, the threshold voltage of the interfered memory cell may be shifted as shown in FIG. 4. When the interference effect is large, the shift of threshold voltage may be large, and as a result, the data stored in the memory cell may be changed or lost.

Referring to FIG. 4, in memory cells, data may be stored in an LSB page first. Then, with the LSB data stored, data may be additionally stored in an MSB page which is coupled to the same word line.

As illustrated in (a) of FIG. 4, a memory cell in an originally erased state may form a threshold voltage distribution VD1 or a threshold voltage distribution VD2 depending on LSB data stored therein. The threshold voltage of the memory cell may form the threshold voltage distribution VD1 in the case where LSB data "1" is stored, and may form the threshold voltage distribution VD2 in the case where LSB data "0" is stored. The LSB data stored in the memory cell may configure an LSB page.

As illustrated in (b) of FIG. 4, the threshold voltage distribution VD1 of the memory cell storing the LSB data "1" may be raised when MSB data "0" is stored in the memory cell. In this regard, as the threshold voltage distribution VD1 is raised, an overlapping section 400 with the threshold voltage distribution VD2 may occur. In other words, as shown, the overlapping section 400 between a threshold voltage distribution VD12' and the threshold voltage distribution VD2 may occur.

As illustrated in (c) of FIG. 4, memory cells storing LSB data may form threshold voltage distributions VD11, VD12, VD21 and VD22 depending on MSB data stored therein. For example, the threshold voltage of a memory cell in which LSB data "1" is stored may form the threshold voltage distribution VD11 in the case where MSB data "1" is additionally stored, and may form the threshold voltage distribution VD12 in the case where MSB data "0" is additionally stored. Moreover, the threshold voltage of a memory cell in which LSB data "0" is stored may form the threshold voltage distribution VD21 in the case where MSB data "0" is additionally stored, and may form the threshold voltage distribution VD22 in the case where MSB data "1" is additionally stored. The MSB data stored in the memory cell may configure an MSB page.

If a sudden power-off (SPO) occurs in the process (b) of FIG. 4, that is, at the time when the overlapping section 400 occurs, the data stored in the LSB page may be lost, and it may be difficult to recover the lost data. According to the prior art, to cope with this problem, the data stored in the LSB page is backed up to another block. According to another prior art, the MSB page coupled to a common word line with the LSB page is left empty and next data is stored in another LSB page coupled to a next word line. However, according to the prior art, an additional block may be consumed or an MSB page may be wasted, whereby overall efficiency may degrade.

Figure 5:
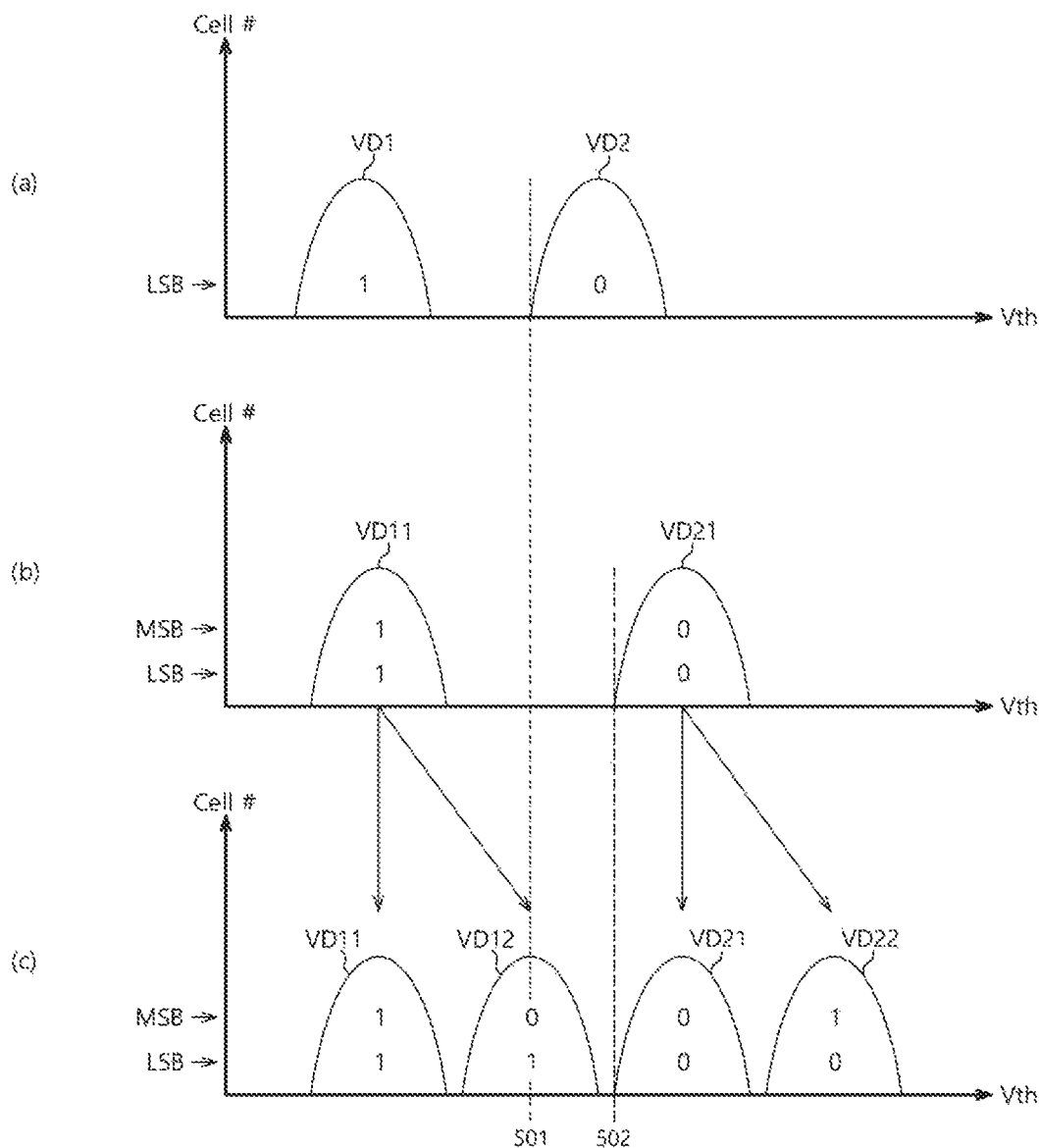
FIG. 5 is a diagram explaining a change in the threshold voltage distribution of cells when the data stored in an LSB page is stored in an MSB page.

FIG. 5 is a diagram explaining a change in the threshold voltage distribution of cells when the data stored in an LSB page is stored in an MSB page according to the embodiment of the present disclosure. Hereinbelow, a process in which the data storage device in accordance with the embodiment stores data will be described with reference to FIG. 5.

As illustrated in (a) of FIG. 5, a memory cell of an originally erased state may form a threshold voltage distribution VD1 or a threshold voltage distribution VD2, depending on LSB data stored therein. The threshold voltage of the memory cell may form the threshold voltage distribution VD1 in the case where LSB data "1" is stored, and may form the threshold voltage distribution VD2 in the case where LSB data "0" is stored. The LSB data stored in the memory cell may configure an LSB page.

As illustrated in (b) of FIG. 5, in the present embodiment, after data is stored in the LSB page, in order to prevent the overlapping section 400 shown in (b) of FIG. 4 in a process of storing data in an MSB page coupled to the same word line, the same data as the data stored in the LSB page may also be stored in the MSB page. For example, MSB data "1" may also be stored in the MSB page in the case where LSB data "1" is stored in the LSB page, and MSB data "0" may also be stored in the MSB page in the case where LSB data "0" is stored in the LSB page.

In this process, a threshold voltage distribution may be raised in comparison with the case where only the LSB data is stored in the LSB page. In detail, the threshold voltage distribution VD1, when only the LSB data "1" is stored, may be raised to a threshold voltage distribution VD11 in the case where the MSB data "1" is also stored in the MSB page, and the threshold voltage distribution VD2, when only the LSB data "0" is stored, may be raised to a threshold voltage distribution VD21 in the case where the MSB data "0" is also stored in the MSB page.

According to the prior art, the overlapping section 400 shown in (b) of FIG. 4 occurs since a voltage 501 of the lowest level in the threshold voltage distribution VD2 becomes to be included in a threshold voltage distribution VD12 due to the shift of the threshold voltage VD1 (to the threshold voltage V12') with the fixed threshold voltage VD2.

As illustrated in (c) of FIG. 5, according to the present embodiment, the shift of the threshold voltage VD1 (to the threshold voltage V12') with the fixed threshold voltage VD2 may be eliminated. Namely, the lowest level in the threshold voltage distribution may be raised in advance from the voltage 501 to a voltage 502, thereby shifting in advance the threshold voltage distribution VD2 to the threshold voltage distribution VD21. Therefore, it is possible to eliminate the possibility of the overlapping section 400, and accordingly, it is possible to decrease the possibility of the data stored in the LSB page from being lost when an SPO occurs.

Figure 6:
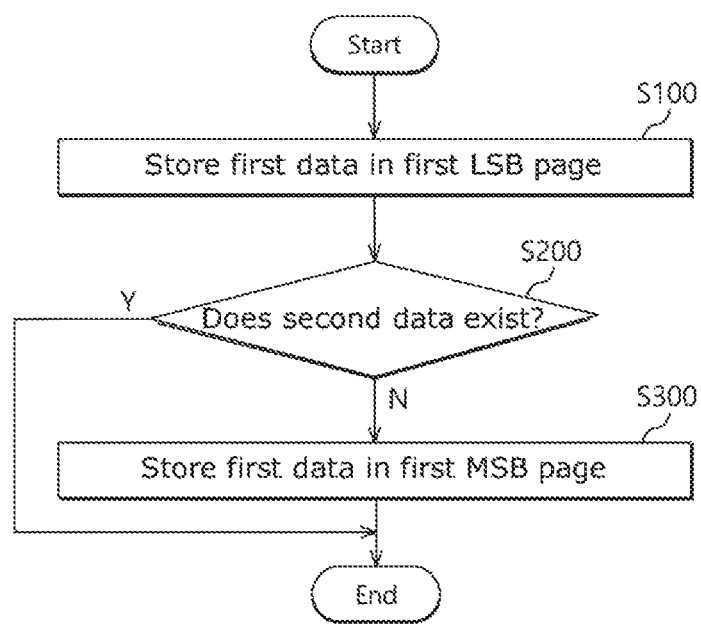
FIG. 6 is a flow chart explaining a method for operating a data storage device in accordance with an embodiment.

FIG. 6 is a flow chart explaining a method for operating a data storage device in accordance with an embodiment of the present disclosure.

Referring to FIG. 6, the method for operating a data storage device in accordance with the embodiment may include a step of storing first data in a first LSB page at step S100, a step of determining whether second data exists in the random access memory which is temporarily storing the second data to be stored in first MSB page that coupled to the same first word line as the first LSB page when the first data is stored in the first LSB page at step S200, and a step of storing the first data in the first MSB page, when the second data does not exist in the random access memory 220 when the first data is stored in the first LSB page at step S300.

Figure 7:
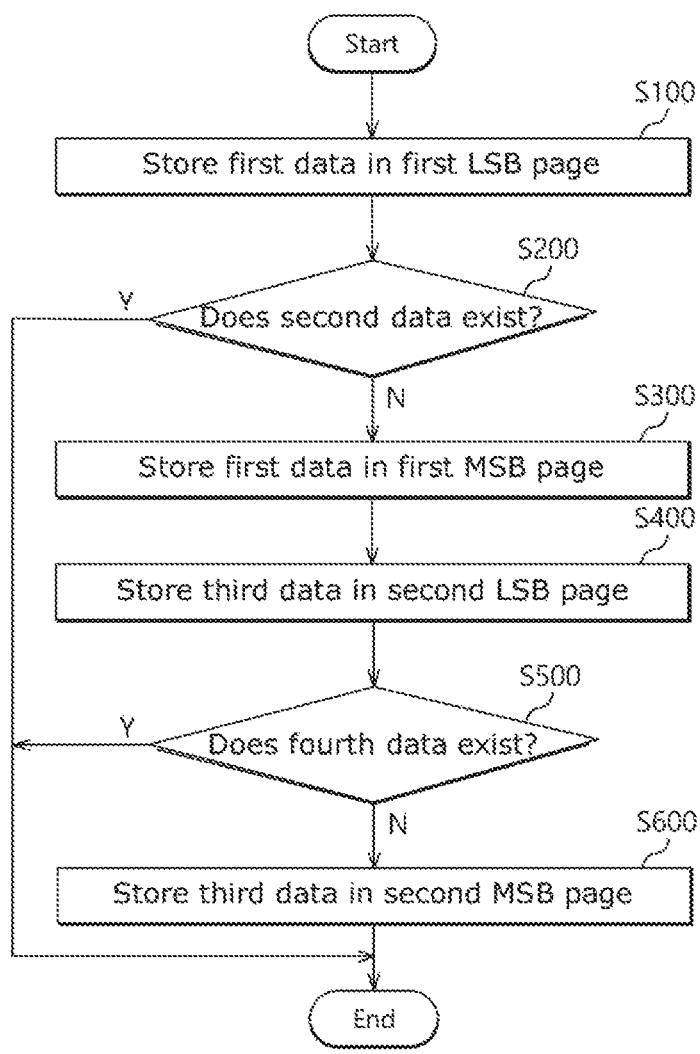
FIG. 7 is a flow chart explaining a method for operating a data storage device in accordance with an embodiment.

FIG. 7 is a flow chart explaining a method for operating a data storage device in accordance with an embodiment of the present disclosure.

Referring to FIG. 7, the method for operating a data storage device in accordance with the embodiment may further include a step of storing third data in a second LSB page at step S400, a step of determining whether fourth data exists in the random access memory which is temporarily storing the fourth data to be stored in second MSB page that coupled to the same first word line as the second LSB page when the third data is stored in the second LSB page at step S500, and a step of storing the third data in the second MSB page when fourth data does not exist in the random access memory when the third data is stored in the second LSB page at step S600.

In the embodiment, the second word line may be a word line which is adjacent to the first word line. That is, after data is stored in the first LSB page, an LSB page in which data is to be stored immediately next may be the second LSB page. Similarly, after data is stored in the first MSB page, an MSB page in which data is to be stored immediately next may be the second MSB page.

Figure 8:
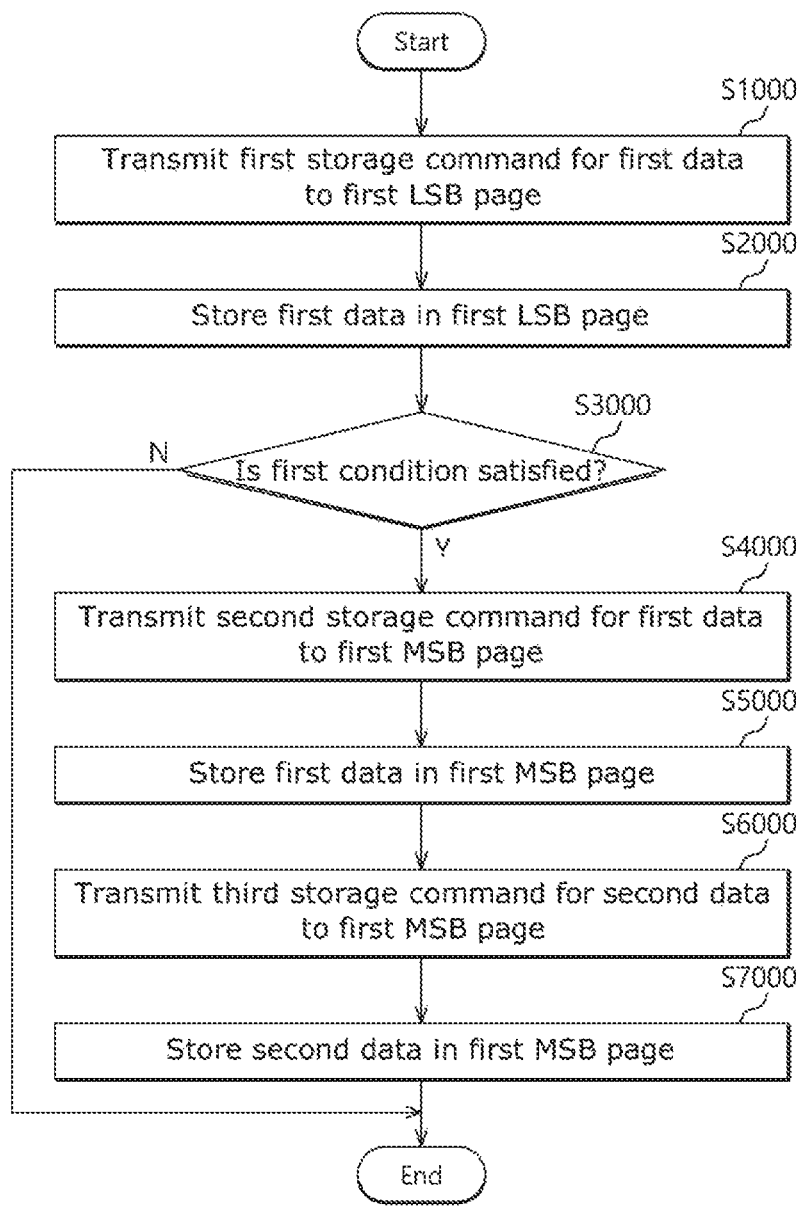
FIG. 8 is a flow chart explaining a method for operating a data storage device in accordance with an embodiment.

FIG. 8 is a flow chart explaining a method for operating a data storage device in accordance with an embodiment of the present disclosure.

Referring to FIG. 8, the method for operating a data storage device in accordance with the embodiment may include a step of transmitting a first storage command for first data to a first LSB page, to a nonvolatile memory device by a controller at step S1000, a step of storing the first data in the first LSB page based on the first storage command by the nonvolatile memory device at step S2000, a step of transmitting a second storage command for the first data to a first MSB page, which is coupled to the same first word line as the first LSB page, to the nonvolatile memory device by the controller at step S4000 when a first condition is satisfied at step S3000, a step of storing the first data in the first MSB page based on the second storage command by the nonvolatile memory device at step S5000, a step of transmitting a third storage command for second data to the first MSB page, to the nonvolatile memory device by the controller at step S6000, and a step of storing the second data in the first MSB page based on the third storage command by the nonvolatile memory device at step S7000.

The method for operating a data storage device in accordance with the embodiment may further include a step of transmitting a fourth storage command for third data to a second LSB page, to the nonvolatile memory device by the controller (not shown), a step of storing the third data in the second LSB page based on the fourth storage command by the nonvolatile memory device (not shown), a step of transmitting a fifth storage command for the third data to a second MSB page which is coupled to the same second word line as the second LSB page, to the nonvolatile memory device by the controller when a second condition is satisfied (not shown), a step of storing the third data in the second MSB page based on the fifth storage command by the nonvolatile memory device (not shown), a step of transmitting a sixth storage command for fourth data to the second MSB page, to the nonvolatile memory device by the controller (not shown), and a step of storing the fourth data in the second MSB page based on the sixth storage command by the nonvolatile memory device (not shown).

Each of the first condition and the second condition may be a condition in which, when data is stored in an LSB page, data to be stored in an MSB page that is coupled to a common word line with the LSB page does not exist. That is, each of the first condition and the second condition may be a condition in which data are not successively stored in an LSB page and an MSB page that is coupled to a common word line with the LSB page.

Further, each of the first condition and the second condition may be a condition in which, after data is stored in an LSB page, data to be stored in an MSB page that is coupled to a common word line with the LSB page does not exist until a reference time passes. The reference time may be set when booting the controller, and may be changed at any point of time through a host device.

In the embodiment, the second word line may be a word line which is adjacent to the first word line. That is, after data is stored in the first LSB page, an LSB page in which data is to be stored immediately next may be the second LSB page. Similarly, after data is stored in the first MSB page, an MSB page in which data is to be stored immediately next may be the second MSB page.

Figure 9:
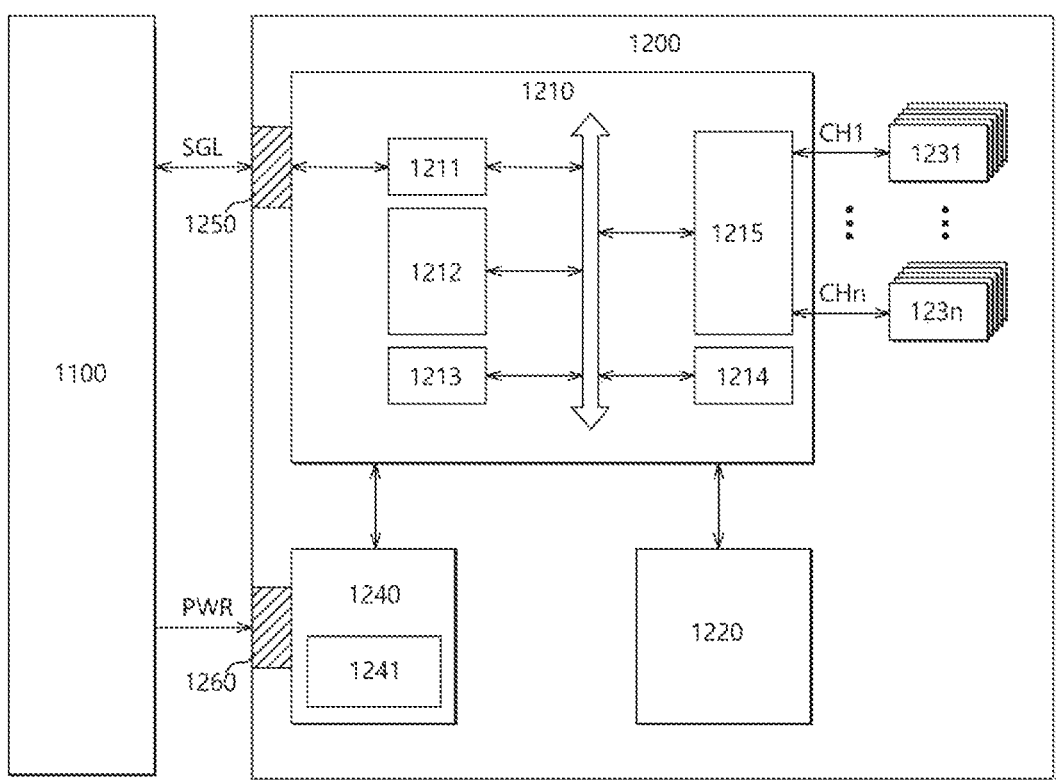
FIG. 9 is a diagram illustrating an example of a data processing system including a solid state drive (SSD) in accordance with an embodiment of the present disclosure.

FIG. 9 is a diagram Illustrating an example of a data processing system including a solid state drive (SSD) in accordance with an embodiment of the present disclosure. Referring to FIG. 9, a data processing system 1000 may include a host device 1100 and a solid state drive (SSD) 1200.

The SSD 1200 may include a controller 1210, a buffer memory device 1220, nonvolatile memory devices 1231 to 123n, a power supply 1240, a signal connector 1250, and a power connector 1260.

The controller 1210 may control general operations of the SSD 1200. The controller 1210 may include a host interface unit 1211, a control unit 1212, a random access memory 1213, an error correction code (ECC) unit 1214, and a memory interface unit 1215.

The host interface unit 1211 may exchange a signal SGL with the host device 1100 through the signal connector 1250. The signal SGL may include a command, an address, data, and so forth. The host interface unit 1211 may interface the host device 1100 and the SSD 1200 according to the protocol of the host device 1100. For example, the host interface unit 1211 may communicate with the host device 1100 through any one of standard interface protocols such as secure digital, universal serial bus (USB), multimedia card (MMC), embedded MMC (eMMC), personal computer memory card international association (PCMCIA), parallel advanced technology attachment (PATA), serial advanced technology attachment (SATA), small computer system Interface (SCSI), serial attached SCSI (SAS), peripheral component Interconnection (PCI), PCI express (PCI-E) and universal flash storage (UFS).

The control unit 1212 may analyze and process a signal SGL inputted from the host device 1100. The control unit 1212 may control operations of internal function blocks according to a firmware or a software for driving the SSD 1200. The random access memory 1213 may be used as a working memory for driving such a firmware or software.

The error correction code (ECC) unit 1214 may generate the parity data of data to be transmitted to the nonvolatile memory devices 1231 to 123n. The generated parity data may be stored together with the data in the nonvolatile memory devices 1231 to 123n. The error correction code (ECC) unit 1214 may detect an error of the data read out from the nonvolatile memory devices 1231 to 123n, based on the parity data. If a detected error is within a correctable range, the error correction code (ECC) unit 1214 may correct the detected error.

The memory interface unit 1215 may provide control signals such as commands and addresses to the nonvolatile memory devices 1231 to 123n, according to control of the control unit 1212. Moreover, the memory interface unit 1215 may exchange data with the nonvolatile memory devices 1231 to 123n, according to control of the control unit 1212. For example, the memory interface unit 1215 may provide the data stored in the buffer memory device 1220, to the nonvolatile memory devices 1231 to 123n, or provide the data read out from the nonvolatile memory devices 1231 to 123n, to the buffer memory device 1220.

The buffer memory device 1220 may temporarily store data to be stored in the nonvolatile memory devices 1231 to 123n. Further, the buffer memory device 1220 may temporarily store the data read out from the nonvolatile memory devices 1231 to 123n. The data temporarily stored in the buffer memory device 1220 may be transmitted to the host device 1100 or the nonvolatile memory devices 1231 to 123n according to control of the controller 1210.

The nonvolatile memory devices 1231 to 123n may be used as storage media of the SSD 1200. The nonvolatile memory devices 1231 to 123n may be coupled with the controller 1210 through a plurality of channels CH1 to CHn, respectively. One or more nonvolatile memory devices may be coupled to one channel. The nonvolatile memory devices coupled to each channel may be coupled to the same signal bus and data bus.

The power supply 1240 may provide power PWR inputted through the power connector 1260, to the inside of the SSD 1200. The power supply 1240 may include an auxiliary power supply 1241. The auxiliary power supply 1241 may supply power to allow the SSD 1200 to be normally terminated when a sudden power-off occurs. The auxiliary power supply 1241 may include large capacity capacitors.

The signal connector 1250 may be configured by various types of connectors depending on an interface scheme between the host device 1100 and the SSD 1200.

The power connector 1260 may be configured by various types of connectors depending on a power supply scheme of the host device 1100.

Figure 10:
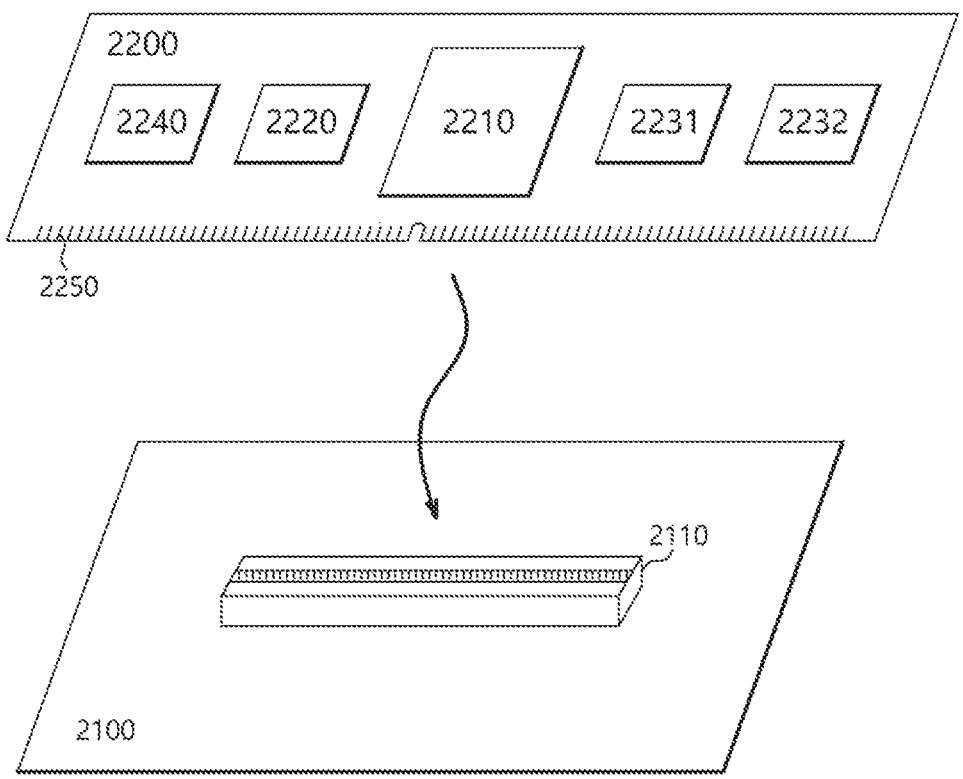
FIG. 10 is a diagram illustrating an example of a data processing system including a data storage device in accordance with an embodiment of the present disclosure.

FIG. 10 is a diagram illustrating an example of a data processing system including a data storage device in accordance with an embodiment of the present disclosure. Referring to FIG. 10, a data processing system 2000 may include a host device 2100 and a data storage device 2200.

The host device 2100 may be configured in the form of a board such as a printed circuit board. Although not shown, the host device 2100 may include internal function blocks for performing the function of a host device.

The host device 2100 may include a connection terminal 2110 such as a socket, a slot or a connector. The data storage device 2200 may be mounted to the connection terminal 2110.

The data storage device 2200 may be configured in the form of a board such as a printed circuit board. The data storage device 2200 may be referred to as a memory module or a memory card. The data storage device 2200 may include a controller 2210, a buffer memory device 2220, nonvolatile memory devices 2231 and 2232, a power management integrated circuit (PMIC) 2240, and a connection terminal 2250.

The controller 2210 may control general operations of the data storage device 2200. The controller 2210 may be configured in the same manner as the controller 1210 shown in FIG. 9.

The buffer memory device 2220 may temporarily store data to be stored in the nonvolatile memory devices 2231 and 2232. Further, the buffer memory device 2220 may temporarily store the data read from the nonvolatile memory devices 2231 and 2232. The data temporarily stored in the buffer memory device 2220 may be transmitted to the host device 2100 or the nonvolatile memory devices 2231 and 2232 according to control of the controller 2210.

The nonvolatile memory devices 2231 and 2232 may be used as storage media of the data storage device 2200.

The PMIC 2240 may provide the power inputted through the connection terminal 2250, to the inside of the data storage device 2200. The PMIC 2240 may manage the power of the data storage device 2200 according to control of the controller 2210.

The connection terminal 2250 may be coupled to the connection terminal 2110 of the host device 2100. Through the connection terminal 2250, signals such as commands, addresses, data and so forth and power may be transferred between the host device 2100 and the data storage device 2200. The connection terminal 2250 may be configured into various types depending on an interface scheme between the host device 2100 and the data storage device 2200. The connection terminal 2250 may be disposed on any one side of the data storage device 2200.

Figure 11:
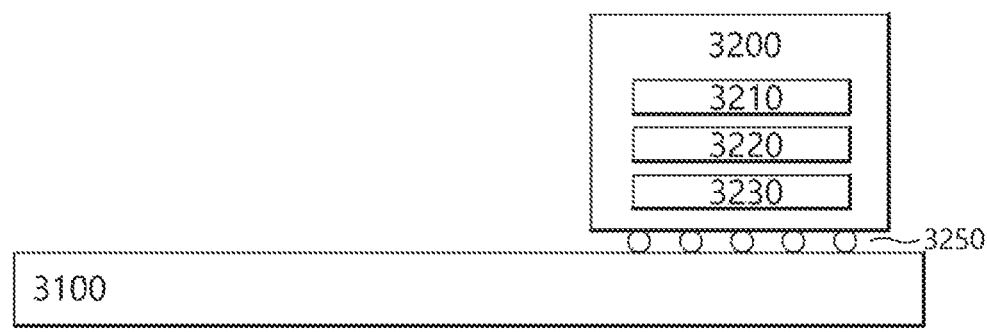
FIG. 11 is a diagram illustrating an example of a data processing system including a data storage device in accordance with an embodiment of the present disclosure.

FIG. 11 is a diagram Illustrating an example of a data processing system including a data storage device in accordance with an embodiment of the present disclosure. Referring to FIG. 11, a data processing system 3000 may include a host device 3100 and a data storage device 3200.

The host device 3100 may be configured in the form of a board such as a printed circuit board. Although not shown, the host device 3100 may include internal function blocks for performing the function of a host device.

The data storage device 3200 may be configured in the form of a surface-mounting type package. The data storage device 3200 may be mounted to the host device 3100 through solder balls 3250. The data storage device 3200 may include a controller 3210, a buffer memory device 3220, and a nonvolatile memory device 3230.

The controller 3210 may control general operations of the data storage device 3200. The controller 3210 may be configured in the same manner as the controller 1210 shown in FIG. 9.

The buffer memory device 3220 may temporarily store data to be stored in the nonvolatile memory device 3230. Further, the buffer memory device 3220 may temporarily store the data read out from the nonvolatile memory device 3230. The data temporarily stored in the buffer memory device 3220 may be transmitted to the host device 3100 or the nonvolatile memory device 3230 according to control of the controller 3210.

The nonvolatile memory device 3230 may be used as a storage medium of the data storage device 3200.

Figure 12:
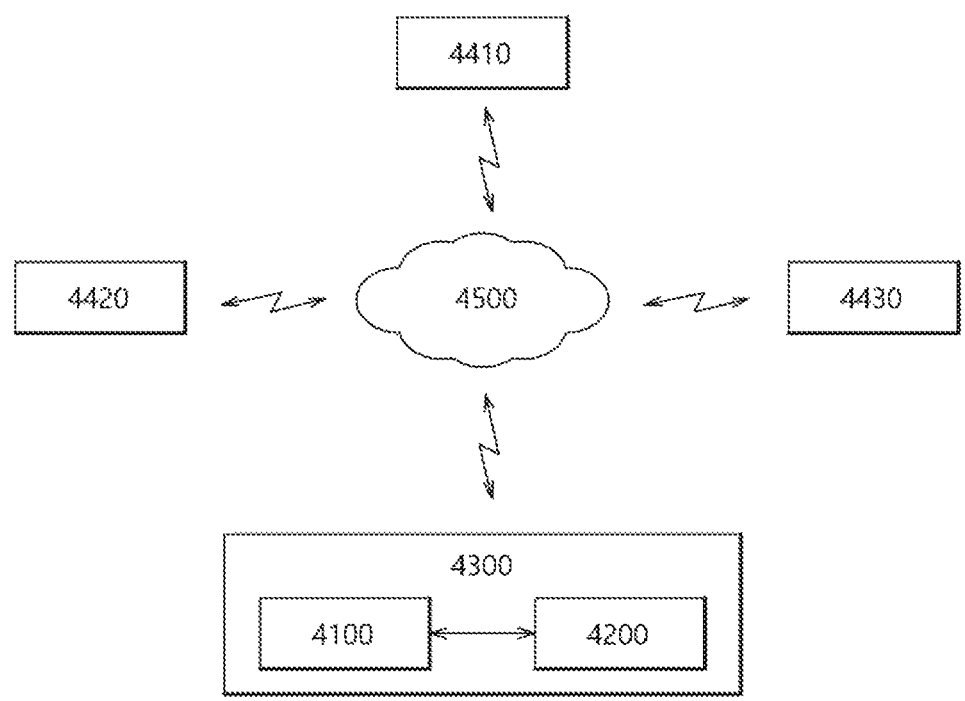
FIG. 12 is a diagram illustrating an example of a network system including a data storage device in accordance with an embodiment of the present disclosure.

FIG. 12 is a diagram illustrating an example of a network system including a data storage device in accordance with an embodiment of the present disclosure. Referring to FIG. 12, the network system 4000 may include a server system 4300 and a plurality of client systems 4410 to 4430 which are coupled through a network 4500.

The server system 4300 may service data in response to requests from the plurality of client systems 4410 to 4430. For example, the server system 4300 may store the data provided from the plurality of client systems 4410 to 4430. For another example, the server system 4300 may provide data to the plurality of client systems 4410 to 4430.

The server system 4300 may include a host device 4100 and a data storage device 4200. The data storage device 4200 may be constructed by the data storage device 100 shown in FIG. 1, the SSD 1200 shown in FIG. 9, the data storage device 2200 shown in FIG. 10 or the data storage device 3200 shown in FIG. 11.

Figure 13:
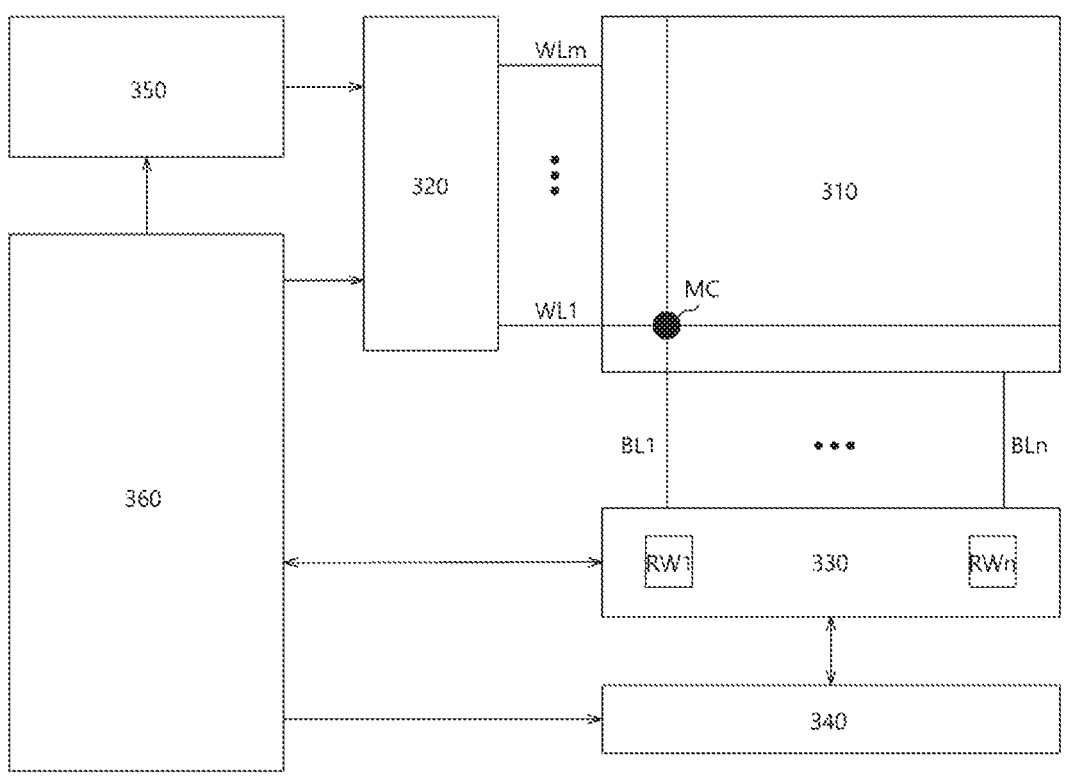
FIG. 13 is a block diagram illustrating an example of a data storage device including a nonvolatile memory device, in accordance with an embodiment of the present disclosure.

FIG. 13 is a block diagram illustrating an example of a data storage device including a nonvolatile memory device, in accordance with an embodiment of the present disclosure. Referring to FIG. 13, a nonvolatile memory device 300 may include a memory cell array 310, a row decoder 320, a data read/write block 330, a column decoder 340, a voltage generator 350, and a control logic 360.

The memory cell array 310 may include memory cells MC which are arranged at areas where word lines WL1 to WLm and bit lines BL1 to BLn intersect with each other.

The row decoder 320 may be coupled with the memory cell array 310 through the word lines WL1 to WLm. The row decoder 320 may operate according to the control of the control logic 360. The row decoder 320 may decode an address provided from an external device (not shown). The row decoder 320 may select and drive the word lines WL1 to WLm, based on a decoding result. For instance, the row decoder 320 may provide a word line voltage provided from the voltage generator 350, to the word lines WL1 to WLm.

The data read/write block 330 may be coupled with the memory cell array 310 through the bit lines BL1 to BLn. The data read/write block 330 may include read/write circuits RW1 to RWn respectively corresponding to the bit lines BL1 to BLn. The data read/write block 330 may operate according to the control of the control logic 360. The data read/write block 330 may operate as a write driver or a sense amplifier depending on an operation mode. For example, the data read/write block 330 may operate as a write driver which stores data provided from the external device, in the memory cell array 310 in a write operation. For another example, the data read/write block 330 may operate as a sense amplifier which reads out data from the memory cell array 310 in a read operation.

The column decoder 340 may operate according to the control of the control logic 360. The column decoder 340 may decode an address provided from the external device. The column decoder 340 may couple the read/write circuits RW1 to RWn of the data read/write block 330 respectively corresponding to the bit lines BL1 to BLn with data input/output lines (or data input/output buffers), based on a decoding result.

The voltage generator 350 may generate voltages to be used in internal operations of the nonvolatile memory device 300. The voltages generated by the voltage generator 350 may be applied to the memory cells of the memory cell array 310. For example, a program voltage generated in a program operation may be applied to a word line of memory cells for which the program operation is to be performed. For still another example, an erase voltage generated in an erase operation may be applied to a well area of memory cells for which the erase operation is to be performed. For still another example, a read voltage generated in a read operation may be applied to a word line of memory cells for which the read operation is to be performed.

The control logic 360 may control general operations of the nonvolatile memory device 300, based on control signals provided from the external device. For example, the control logic 360 may control the read, write and erase operations of the nonvolatile memory device 300.

The descriptions for the above-described device may be applied to the methods in accordance with the embodiments of the present disclosure. Therefore, descriptions the same as the descriptions for the above-described device are omitted in the methods.

While various embodiments have been described above, it will be understood to those skilled in the art that the embodiments described are examples only. Accordingly, the data storage device and the operating method thereof described herein should not be limited based on the described embodiments.

What is claimed is:

1. A data storage device comprising:
   a nonvolatile memory device configured to include a plurality of pages; and
   a controller configured to control an operation of the nonvolatile memory device, wherein the controller is configured to:
store first data in a first least significant bit (LSB) page,
store the same data as the first data in a first most significant bit (MSB) page which is coupled to the same first word line as the first LSB page, when a first condition is satisfied, and
store second data different from the first data in the first MSB page after the first data is stored in the first MSB page.

2. The data storage device according to claim 1, wherein the first condition is a condition in which the second data does not exist when the first data is stored in the first LSB page.

3. The data storage device according to claim 1, wherein the first condition is a condition in which the second data does not exist until a reference time passes after the first data is stored in the first LSB page.

4. The data storage device according to claim 1, wherein the controller stores third data in a second LSB page, stores the same data as the third data in a second MSB page which is coupled to the same second word line as the second LSB page, when a second condition is satisfied, and stores fourth data different from the third data in the second MSB page after the third data is stored in the second MSB page.

5. The data storage device according to claim 4, wherein the controller stores the third data in the second LSB page before storing the second data in the first MSB page.

6. The data storage device according to claim 4, wherein the second condition is a condition in which the fourth data does not exist when the third data is stored in the second LSB page.

7. The data storage device according to claim 4, wherein the second condition is a condition in which the fourth data does not exist until a reference time passes after the third data is stored in the second LSB page.

8. A method for operating a data storage device, comprising:
storing first data in a first least significant bit (LSB) page; and
storing the same data as the first data in a first most significant bit (MSB) page which is coupled to the same first word line as the first LSB page, when second data different from the first data does not exist at the first data is stored in the first LSB page.

9. The method according to claim 8, further comprising: storing the second data in the first MSB page.

10. The method according to claim 8, wherein, in the storing of the same data as the first data in the first MSB page, the same data as the first data is stored in the first MSB page when the second data does not exist until a reference time passes after the first data is stored in the first LSB page.

11. The method according to claim 8, further comprising:
storing third data in a second LSB page; and
storing the same data as the third data in a second MSB page which is coupled to the same second word line as the second LSB page, when fourth data different from the third data does not exist when the third data is stored in the second LSB page.

12. The method according to claim 11, wherein the third data is stored in the second LSB page before storing the second data in the first MSB page.

13. The method according to claim 11, further comprising:
storing the fourth data in the second MSB page.

14. The method according to claim 11, wherein, in the storing of the same data as the third data in the second MSB page, the same data as the third data is stored in the second MSB page when the fourth data does not exist until a reference time passes after the third data is stored in the second LSB page.

15. A method for operating a data storage device, comprising:
transmitting a first storage command for first data to a first least significant bit (LSB) page, to a nonvolatile memory device by a controller;
storing the first data in the first LSB page based on the first storage command by the nonvolatile memory device;
transmitting a second storage command for the same data as the first data to a first most significant bit (MSB) page which is coupled to the same first word line as the first LSB page, to the nonvolatile memory device by the controller when a first condition is satisfied;
storing the same data as the first data in the first MSB page based on the second storage command by the nonvolatile memory device;
transmitting a third storage command for second data different from the first data to the first MSB page, to the nonvolatile memory device by the controller; and
storing the second data in the first MSB page based on the third storage command by the nonvolatile memory device.

16. The method according to claim 15, wherein the first condition is a condition in which the second data does not exist when the first data is stored in the first LSB page.

17. The method according to claim 15, wherein the first condition is a condition in which the second data does not exist until a reference time passes after the first data is stored in the first LSB page.

18. The method according to claim 15, further comprising:
transmitting a fourth storage command for third data to a second LSB page, to the nonvolatile memory device by the controller;
storing the third data in the second LSB page based on the fourth storage command by the nonvolatile memory device;
transmitting a fifth storage command for the same data as the third data to a second MSB page which is coupled to the same second word line as the second LSB page, to the nonvolatile memory device by the controller when a second condition is satisfied;
storing the same data as the third data in the second MSB page based on the fifth storage command by the nonvolatile memory device;
transmitting a sixth storage command for fourth data different from the third data to the second MSB page, to the nonvolatile memory device by the controller; and
storing the fourth data in the second MSB page based on the sixth storage command by the nonvolatile memory device.

19. The method according to claim 18, wherein the controller stores the third data in the second LSB page before storing the second data in the first MSB page.

20. The method according to claim 18, wherein the second condition is a condition in which the fourth data does not exist when the third data is stored in the second LSB page.

* * * * *